(12) United States Patent
Ito et al.

(10) Patent No.: US 10,839,876 B1
(45) Date of Patent: Nov. 17, 2020

(54) APPARATUSES AND METHODS FOR CLOCK LEVELING IN SEMICONDUCTOR MEMORIES

(71) Applicant: MICRON TECHNOLOGY, INC., Boise, ID (US)

(72) Inventors: Koji Ito, Sagamihara (JP); Keisuke Tada, Sagamihara (JP); Mototada Sakashita, Kawasaki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/685,708

(22) Filed: Nov. 15, 2019

(51) Int. Cl.
G11C 8/00 (2006.01)
G11C 7/22 (2006.01)
G11C 7/10 (2006.01)
G11C 11/4076 (2006.01)
H03K 23/00 (2006.01)

(52) U.S. Cl.
CPC ............ G11C 7/222 (2013.01); G11C 7/1066 (2013.01); G11C 7/1072 (2013.01); G11C 11/4076 (2013.01); H03K 23/002 (2013.01); G11C 2207/2272 (2013.01)

(58) Field of Classification Search
CPC ..... G11C 7/222; G11C 7/1066; G11C 7/1072; G11C 11/4076; G11C 2207/2272; H03K 23/002

USPC ....................................................... 365/233.1
See application file for complete search history.

(56) References Cited

U.S. PATENT DOCUMENTS 8,988,966 B2 * 3/2015 Kwak .................. G11C 7/1066
365/233.1
2020/0211606 A1 * 7/2020 Kim ........................ G11C 7/222

* cited by examiner

Primary Examiner — Huan Hoang
(74) Attorney, Agent, or Firm — Dorsey & Whitney LLP

(57) ABSTRACT

Apparatuses and methods for clock leveling in semiconductor memory are disclosed. In an example apparatus, a latency control circuit is configured to provide in first and second modes an active first control signal having a timing based on latency information and a system clock. A clock leveling control circuit is configured to provide in the first mode an active second control signal responsive to an active first control signal at a clock transition of a first clock and further configured to provide in the second mode clock leveling feedback responsive to the active first control signal at a transition of a second clock. A read clock circuit is configured to provide the multiphase clocks responsive to the active second control signal. A serializer circuit configured to serialize the data based on the multiphase clocks from the read clock circuit to provide the data in series.

20 Claims, 7 Drawing Sheets

APPARATUSES AND METHODS FOR CLOCK LEVELING IN SEMICONDUCTOR MEMORIES

BACKGROUND

Semiconductor memories are used in many electronic systems to store data that may be retrieved at a later time. As demand has increased for electronic systems to be faster, have greater memory capacity, and have additional features, semiconductor memories that may be accessed faster, store more data, and include new features have been continually developed to meet the changing needs. Each succeeding generation of semiconductor memories are developed with the aim of improving performance of the memories in the electronic systems.

Semiconductor memories are generally controlled by providing the memories with command and address signals, and clock signals. The various signals may be provided by a memory controller, for example. The command and address signals include memory commands and memory addresses that control the semiconductor memories to perform various memory operations at memory locations corresponding to the memory addresses. For example, a read operation may be performed to retrieve data from a memory, and a write operation may be performed to store data to the memory. The memories may be provided with clocks that are used for timing command signals, address signals, and data signals. The various clocks may be used to generate internal clocks for controlling the timing of memory operations that are performed in response to memory commands.

The timing of various clocks provided to the memories, as well as the internal clocks generated by the memories are controlled for proper operation. In some electronic systems, memories are coupled in series and the timing of the various signals provided to the memories (e.g., clocks, command and address signals, data signals, etc.) may be skewed. The timing of the signals may be adjusted in order to compensate for the skew. The timing of the signals relative to one another (e.g., a system clock relative to a data clock) at each of the memories may be different.

It may be desirable for memories to provide information regarding the relative timing of signals (e.g., clocks) provided to the memories.

DETAILED DESCRIPTION

Certain details are described to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
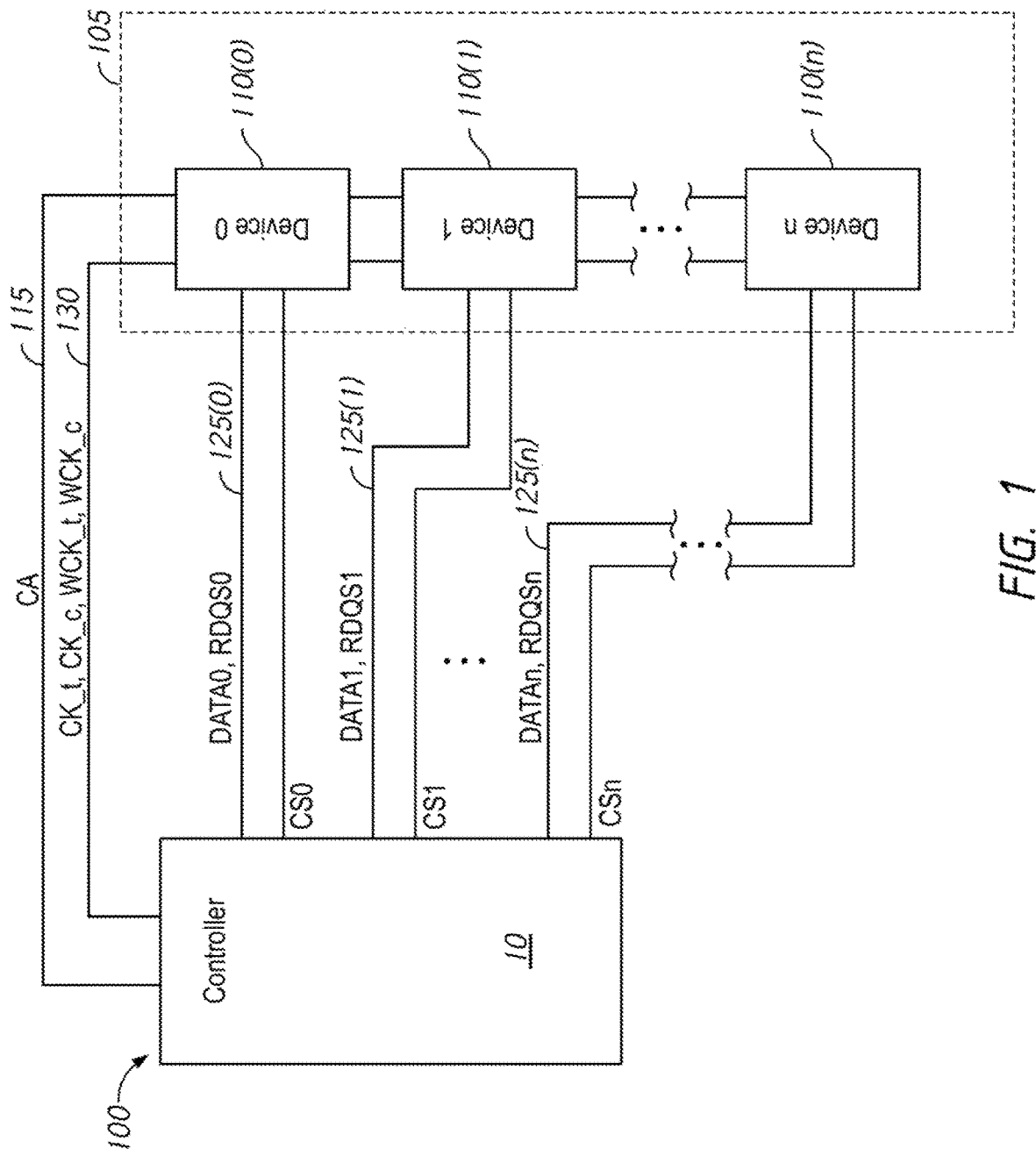
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(n) (e.g., "Device0" through "Devicen"), where n is a non-zero whole number. The memories 110 may be dynamic random access memory (DRAM), such as low power double data rate (LPDDR) DRAM in some embodiments of the disclosure. The memories 110(0)-110(n) are coupled to command/address and clock busses, and each memory 110 is coupled to a respective data and data strobe bus. The memories 110 may be coupled in series in "fly-by" topology.

Each of the busses may include one or more signal lines on which signals are provided. The controller 10 and the memory system 105 are in communication over the several busses. For example, commands and addresses (CA) signals are received by the memory system 105 on a command/address bus 115. Various clocks may be provided between the controller 10 and memory system 105 over a clock bus 130. The clock bus 130 may include signal lines for providing system clocks CK_t and CK_c received by the memory system 105, and data clocks WCK_t and WCK_c received by the memory system 105. Data and data strobes RDQS are provided between the controller 10 and the memory system 105 over respective data and data strobe busses 125.

The CK_t and CK_c clocks provided by the controller 10 to the memory system 105 are used for timing the provision and receipt of the commands and addresses. The WCK_t and WCK_c clocks may be used for timing data transfers. The CK_t and CK_c clocks are complementary and the WCK_t and WCK_c clocks are complementary. The data strobes RDQS may be provided with data (e.g., read data) provided between the controller 10 and the memories 110 of the memory system 105.

The controller 10 provides commands to the memory system 105 to perform memory operations. Non-limiting examples of memory commands include timing commands for controlling the timing of various operations, mode register write and read commands to program information or access information in a mode register, and access commands for accessing the memory, such as read commands for performing read operations and write commands for performing write operations.

Each of the memories 110 of the memory system 105 may also be provided a respective select signal CS. The select signals provided on respective select signal lines are used to select which of the memories 110 will respond to the command and perform the corresponding operation. The controller 10 provides an active select signal to select the corresponding memory 110. While the respective select signal is active, the corresponding memory 100 is selected to receive the commands and addresses provided on the command/address bus 115.

In operation, when an activation command and read command, and associated address are provided by the controller 10 to the memory system 105, the memory 110 selected by the select signals receives the commands and associated address, and performs a read operation to provide the controller 10 with read data from a memory location corresponding to the associated address. In preparation of the selected memory 110 providing the read data to the controller 10, the controller provides active WCK_t and WCK_c clocks to the memory system 105. The WCK_t and WCK_c clocks may be used by the selected memory 110 to generate a data strobe RDQS. The data strobe RDQS is provided by the memory 110 performing the read operation to the controller 10 for timing the provision of read data to the controller 10. The controller 10 may use the data strobe RDQS for receiving the read data.

When an activation command and write command, and associated address are provided by the controller 10 to the memory system 105, the memory 110 selected by the select signals receives the commands and associated address, and performs a write operation to write data from the controller 10 to a memory location corresponding to the associated address. In preparation of the selected memory 110 receiving the write data from the controller 10, the controller provides active WCK_t and WCK_c clocks to the memory system 105. The WCK_t and WCK_c clocks may be used by the selected memory 110 to generate internal clocks for timing the operation of circuits to receive the write data. The data is provided by the controller 10 and the selected memory 110 receives the write data according to the WCK_t and WCK_t clocks, which is written to memory corresponding to the memory addresses.

In embodiments of the disclosure including the memories 110 coupled in series in a fly-by topology, the timing of various signals provided to the memories 110 may be skewed. To account for this skew, the memories 110 may include clock leveling operations to compensate for signal skew, for example, timing skew between clocks provided to the memories 110. Information regarding the timing skew may be provided to the controller 10, for example, which can adjust the timing of the signals provided to the memories 110 (e.g., clocks, data signals, data strobes, etc.) to account for the timing skew.

Figure 2:
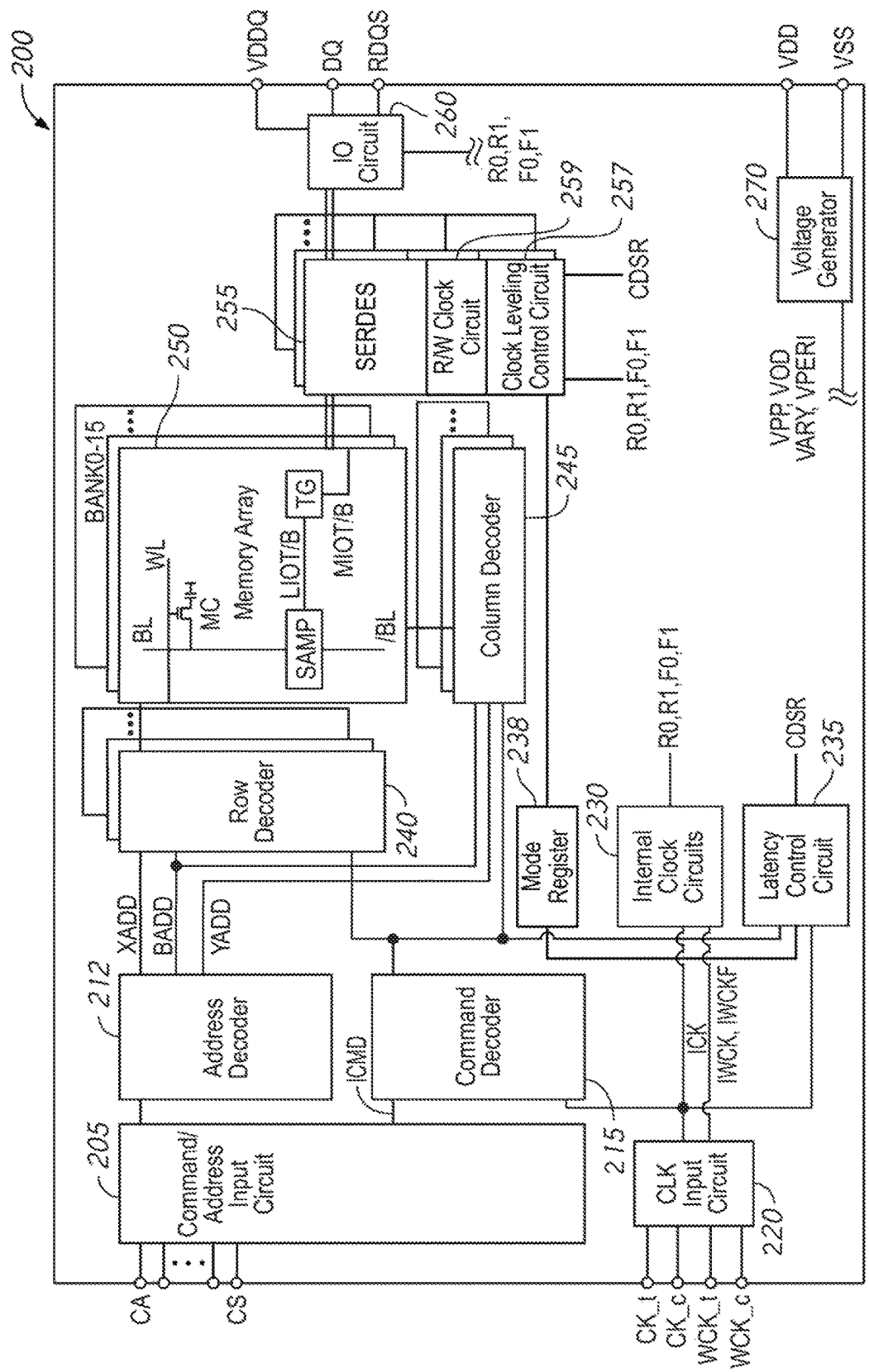
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred as such. In some embodiments, the semiconductor device 200 may include, without limitation, a memory, such as a LPDDR memory integrated into a single semiconductor die, for example. In some embodiments of the disclosure, the semiconductor die may include only semiconductor device 200. In some embodiments of the disclosure, the semiconductor die may include the semiconductor device 200 embedded with other systems integrated on the same semiconductor die. The semiconductor device 200 may be included in the memory system 105 of FIG. 1 in some embodiments of the disclosure. For example, each of the memories 110 may include a semiconductor device 200.

The semiconductor device 200 may include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals (e.g., pins) that include command/address terminals coupled to a command/address bus to receive command and address signals CA. A command/address input circuit 205 receives the CA signals at the command/address terminals and provides address signals and provides internal command signals ICMD to the address decoder 212 and the command decoder 215, respectively. The address signals and command signals are based on the combination of values of the CA signals received by the command/address input circuit 205.

The address decoder 212 receives the address signals and provides decoded row address signals XADD to the row decoder 240, and decoded column address signals YADD to the column decoder 245. The address decoder 212 also provides bank address signals BADD to the row decoder 240 and the column decoder 245. The command decoder 215 includes circuits to decode the command signals ICMD to generate various internal signals and commands for performing operations. For example, the command decoder 215 provides internal signals based on the command signals to control the circuits of the semiconductor device 200 to perform memory operations, such as to read data from or write data to the memory array 250 based on a read command or a write command, respectively, or to program information or access information in a mode register.

The semiconductor device 200 may further employ a select terminal to receive a select signal CS, clock terminals to receive clocks CK_t and CK_c, data clock terminals to receive data clocks WCK_t and WCK_c, data terminals DQ and RDQS, power supply terminals VDD, VSS, and VDDQ. The select terminal may be provided a select signal CS used to select the semiconductor device 200 to receive the CA signals. For example, when the CS signal is active (e.g., active high logic level) the semiconductor device 200 is activated to receive the CA signals on a command/address bus, for example, command/address bus 115 of FIG. 1.

When an activation command is received and bank and row addresses are timely provided with the activation command, and a read command is received and bank and column addresses are timely provided with the read command, read data is read from memory in the memory array 250 designated by the addresses. The command/address input circuit 205 provides the activation and read commands to the command decoder 215 and provides the addresses to the address decoder 212. The command decoder 215 provides internal commands to input/output circuit 260 and the address decoder 212 provides decoded addresses to the row and column decoders so that read data from the memory designated by the addresses is output to outside from the data terminals DQ via serializer/deserializer (SERDES) circuitry 255 and the input/output circuit 260 according to the RDQS clocks.

When an activation command is received and bank and row addresses are timely provided with the activation command, and a write command is received and bank and column addresses are timely provided with the write command, write data provided to the data terminals DQ is written to memory in the memory array 250 designated by the addresses. The command/address input circuit 205 provides the activation and write commands to the command decoder 215 and provides the addresses to the address decoder 212. The command decoder 215 provides internal commands to the input/output circuit 260 and the address decoder 212 provides decoded addresses to the row and column decoders so that the write data is received by data receivers in the input/output circuit 260, and provided via the input/output circuit 260 and the SERDES circuitry 255 to the memory of the memory array 250 designated by the addresses.

The SERDES circuitry 255 may support read and write operations by deserializing write data and serializing high speed read data. For example, during a write operation, the SERDES circuitry 255 may be configured to receive serialized write data from the/O circuit 260 and deserialize the serialized write data (e.g., make it parallel) to provide deserialized write data to memory cell array 250. Additionally, deserialized read data may be received from the memory cell array 250, and the SERDES circuitry 255 may be configured to serialize the deserialized read data to provide serialized read data to the I/O circuit 260.

The clock terminals and data clock terminals are provided with external clocks. The external clocks CK_t, CK_c, WCK_t, WCK_c may be provided to a clock input circuit 220. The CK_t and CK_c clocks may be complementary and the WCK_t and WCK_c clocks may be complementary. The clock input circuit 220 may receive the external clocks to generate internal clocks ICK (based on the CK_t and CK_c clocks) and IWCK and IWCKF (based on the WCK_t and WCK_c clocks). The internal clocks ICK and IWCK and IWCKF are provided to internal clock circuits 230. The internal clock circuits 230 includes circuits that provide various phase and frequency controlled internal clocks R0, R1, F0, F1 based on the received internal clocks. The clocks R0, R1, F0, F1 may be provided to the input/output circuit 260 for controlling, for example, an output timing of read data and the input timing of write data. A latency control circuit 235 is provided the internal clock ICK and provides a control signal CDSR having a timing based at least in part on the ICK clock (e.g., CK_t and CK_c clocks).

The clocks R0, R1, F0, F1 may have clock frequencies that are lower than the frequency of the data clock WCK_t (and WCK_c) and have phases relative to one another. For example, in some embodiments of the disclosure, the F0 clock may have a phase of 90 degrees relative to the R0 clock, the R1 clock may have a phase of 90 degrees relative to the F0 clock, and the F1 clock may have a phase of 90 degrees relative to the R1 clock. In such embodiments, the R0 and R1 clocks may be complementary and the F0 and F1 clocks may be complementary.

The power supply terminals are provided with power supply potentials VDD and VSS. These power supply potentials VDD and VSS are provided to an internal voltage generator circuit 270. The internal voltage generator circuit 270 generates various internal potentials VPP, VOD, VARY, VPERI, and the like based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks.

The power supply terminal is also provided with power supply potential VDDQ. The power supply potentials VDDQ is provided to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

A mode register 238 may be programmed with mode information to select and/or set various operating conditions for circuits of the semiconductor device 200. Mode information may also be accessed to provide status of the semiconductor device 200. Mode information may be programmed by a mode register write operation and mode information may be accessed by a mode register read operation. For example, a clock leveling mode may be set by programming mode information in the mode register 238 to perform clock leveling operations. In another example, an internal clock frequency may be set by programming mode information in the mode register 238. In another example, latency values (e.g., read latency RL (CAS latency), write latency WL, etc.) may be set by programming values in the mode register 238 that correspond to ranges of system clock frequency. For example, mode information related to the latency values may be provided to the latency control circuit 235 and used for timing the control signal CDSR.

Mode register information may also be provided to a clock leveling control circuit 257. The clock leveling control circuit 257 is further provided at least one of the clocks R0, R1, F0, and F1 from internal clock circuits 230 and also receives the control signal CDSR from the latency control circuit 235. The mode information may set operation of the clock leveling control circuit 257. For example, the clock leveling control circuit 257 may be set by the mode information to provide one or more control signals having a timing based on the at least one of the clocks R0, R1, F0, F1, and/or control signal CDSR. The clock leveling control circuit 257 may further provide a feedback signal indicative of a relative timing between the data clock WCK_t and the system clock CK_t. The feedback signal may be provided for clock leveling purposes, for example, to a controller. A read/write clock circuit 259 receives clocks R0, R1, F0, F1 from the internal clock circuits 230 and control signals from the clock leveling control circuit 257, and provides the clocks to the SERDES circuitry 255 for timing serialize and deserialize operations to data.

Figure 3:
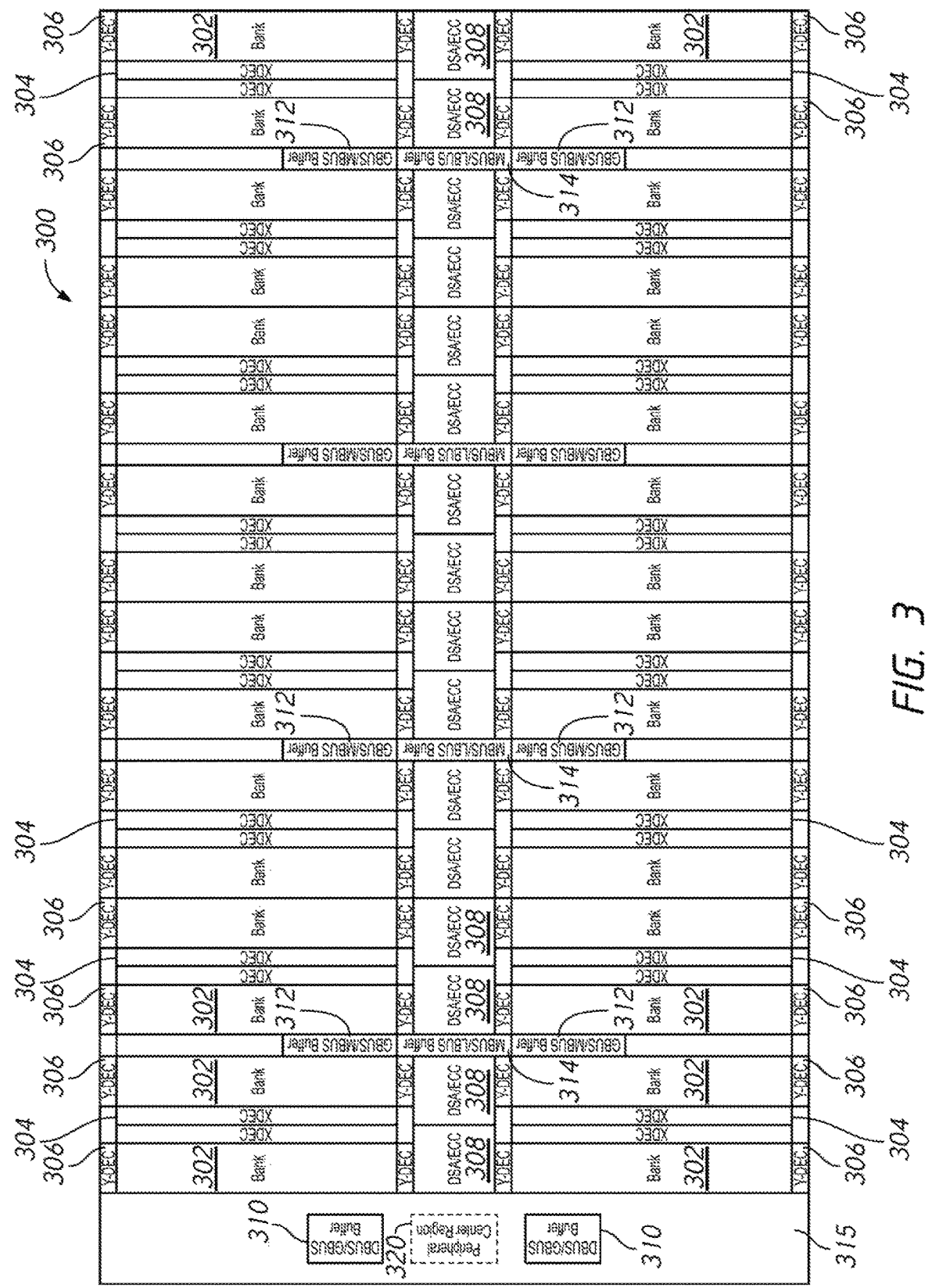
FIG. 3 is a diagram of a layout for a semiconductor device according to an embodiment of the disclosure.

FIG. 3 is a diagram of a layout for a semiconductor device 300 according to an embodiment of the disclosure. In some embodiments, semiconductor device 300 may include at least a portion of semiconductor device 200 shown in FIG. 2 and for memories 110 of FIG. 1.

Briefly, the semiconductor device 300 may include one or more banks 302 of a memory array (e.g., memory array 250) and row decoders 304 and column decoders 306 for each bank 302. In some embodiments, each bank 302 may have its own data sense amplifier and error correction code (DSA/ECC) circuit 308. In other embodiments, the DSA/ECC circuit 308 may be shared between two or more banks 302.

Data may be received from DQ pads DQ15-0 and provided to a data bus DBUS. The data from each of the DQ pads DQ15-0 may be serialized data (e.g., bits are provided one at a time in sequence). In some embodiments, the data from the DQ pads DQ15-0 may be de-serialized by de-serializer circuits (not shown in FIG. 3) prior to being provided to the data bus DBUS. The data bus DBUS may provide the data to an appropriate global data bus GBUS via a DBUS/GBUS buffer 310. The global data bus GBUS may provide the data to an appropriate main data bus MBUS via a GBUS/MBUS buffer 312. The main data bus MBUS may provide the data to an appropriate local data bus LBUS via an MBUS/LBUS buffer 314. The local data bus LBUS may provide the data to the appropriate DSA/ECC circuit 308 for storage in a desired bank 302. The appropriate MBUS and LBUS may be selected based, at least in part, on a bank address and/or column address provided with an access command.

A peripheral region 315 includes various peripheral circuits that are used for performing memory operations. For example, DBUS/GBUS buffers 310 may be located in the peripheral region 315. In some embodiments of the disclosure the circuits of a command/address input circuit, address decoder, command decoder, internal clock circuits, latency control circuits, mode registers, and/or data buffer circuits are located in the peripheral region 315. The peripheral region 315 may include a peripheral center region 320 located generally in the center of the peripheral region 315. Some of the circuits previously described may be located in the peripheral center region 320 whereas other circuits may be located outside of the peripheral center region.

Figure 4:
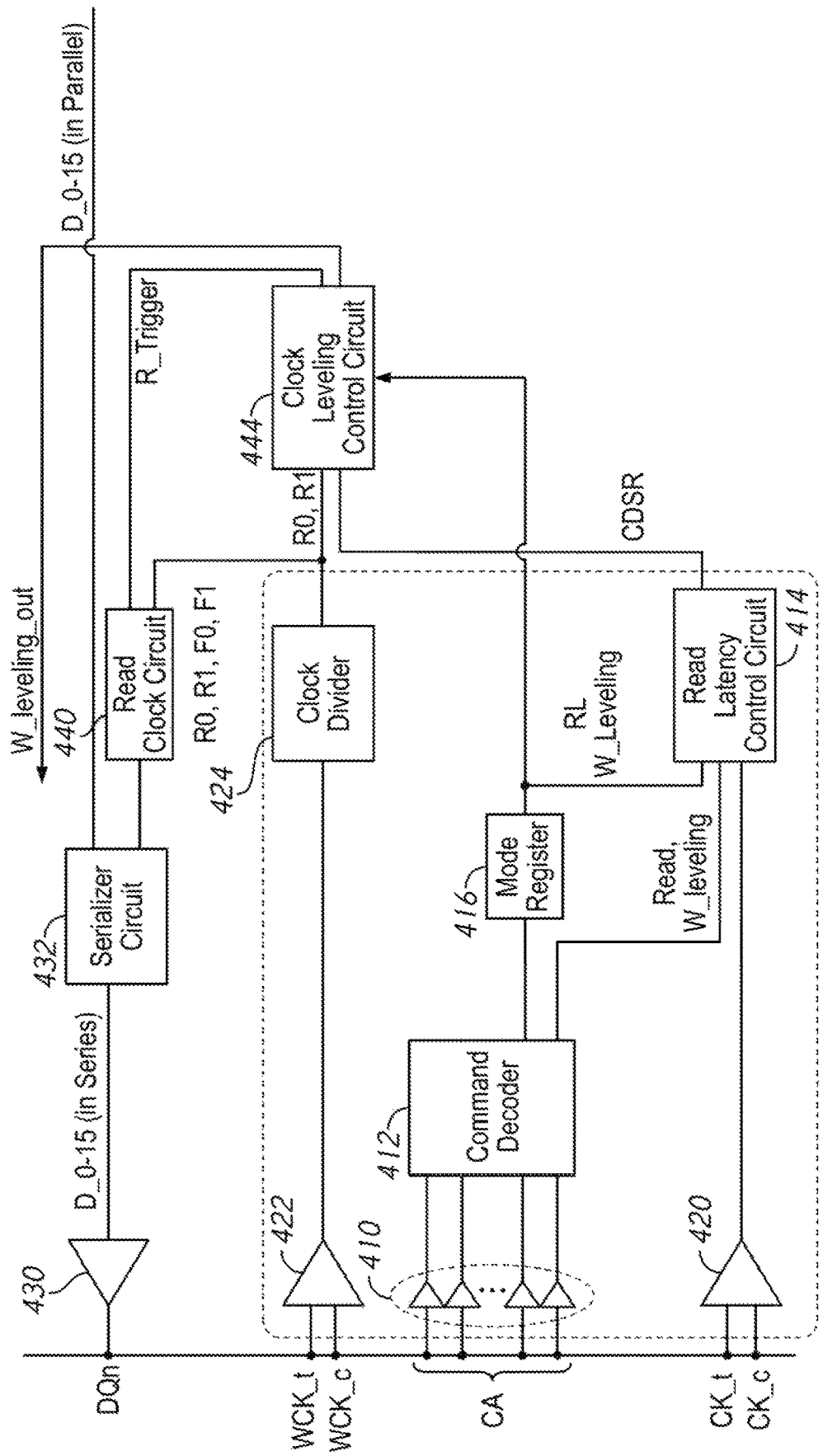
FIG. 4 is a diagram of circuits for read operations and clock leveling operations for a semiconductor device according to an embodiment of the disclosure.

FIG. 4 is a diagram of circuits for read operations and clock leveling operations for a semiconductor device according to an embodiment of the disclosure. The circuits of FIG. 4 may be included in various circuits of a semiconductor device, for example, semiconductor device 100 of FIG. 1. For example, in some embodiments of the disclosure, the circuits of FIG. 4 may be included amongst the clock input circuit 220, command decoder 215, mode register 238, internal clock circuits 230, serializer/deserializer circuit 255, input/output circuit 260, read/write clock circuit 259, clock leveling control circuit 257, and/or latency control circuit 235.

Signal buffers 410 receive command and address signals CA and provide buffered CA signals to a command decoder 412. The command decoder 412 decodes the buffered CA signals and provides internal control and timing signals to perform operations accordingly. For example, the command decoder 412 may decode a read command from the buffered CA signals and provide internal control signal Read to a read latency control circuit 414. In another example, the command decoder 412 may decode a clock leveling command from the buffered CA signals and provide internal clock leveling feedback W_leveling to the read latency control circuit 414. The read latency control circuit 414 may include a counter circuit in some embodiments of the disclosure.

The command decoder 412 may also access mode information programmed in a mode register 416. The mode information may be programmed in the mode register 416 to select and/or set various operating conditions for circuits of the semiconductor device. For example, a clock leveling mode may be set by programming mode information in the mode register 416. While in the clock leveling mode, clock leveling operations may be performed. In another example, latency values (e.g., read latency RL, write latency WL, etc.) may be set by programming values that correspond to ranges of system clock frequency.

A clock buffer 420 receives and buffers the system clock CK_t (and its complement CK_c) and provides buffered system clock(s) to the read latency control circuit 414. The read latency control circuit 414 may provide an active control signal CDSR having a timing based at least in part on a number of clock cycles of the buffered system clock. For example, an active control signal CDSR may be provided at a number of clock cycles following a read command that is based on a difference between a latency value and a data path delay. The data path delay may be a propagation delay through a data path as measured in clock cycles of the system clock CK_t. In some embodiments of the disclosure, an active control signal CDSR may be a pulse signal, that is, the CDSR signal transitions to a high logic level for a period of time (e.g., pulse width) before returning to a low logic level.

A clock buffer 422 receives and buffers a data clock WCK_t (and its complement WCK_c) and provides buffered data clock(s) to a clock divider circuit 424. The data clock WCK_t may have a higher clock frequency than the system clock CK_t. For example, in some embodiments of the disclosure, the data clock WCK_t may have twice the clock frequency of the CK_t clock. In some embodiments of the disclosure, the data clock WCK_t may have four times the clock frequency of the CK_t clock.

The clock divider circuit 424 provides clocks R0, R1, F0, F1 based on the buffered data clock. The clocks R0, R1, F0, F1 have clock frequencies that are lower than the frequency of the data clock WCK_t (and WCK_c) and have phases relative to one another. For example, in some embodiments of the disclosure, the F0 clock may have a phase of 90 degrees relative to the R0 clock, the R1 clock may have a phase of 90 degrees relative to the F0 clock, and the F1 clock may have a phase of 90 degrees relative to the R1 clock. In such embodiments, the R0 and R1 clocks may be complementary and the F0 and F1 clocks may be complementary.

In some embodiments of the disclosure, the clock divider circuit 424 may include circuits (e.g., delay circuits) for shifting the timing of the clocks R0, R1, F0, F1. Shifting the timing of the clocks R0, R1, F0, F1 may be used to adjust a timing relative to another clock or signal, such as relative to the control signal CDSR (and the system clock CK_t).

The signal buffers 410 may be included in a command and address input circuit (e.g., command and address input circuit 205 of FIG. 2) in some embodiments of the disclosure. The command decoder 412 may be included in a command decoder (e.g., command decoder 215) in some embodiments of the disclosure. The clock buffers 420 and 422 may be included in a clock input circuit (e.g., clock input circuit 220) in some embodiments of the disclosure. The clock divider circuit 424 may be included in an internal clock circuit (e.g., internal clock circuits 230) in some embodiments of the disclosure. The mode register 416 may be in a mode register (e.g., mode register 238) in some embodiments of the disclosure. The read latency control circuit 414 may be included in a latency control circuit (e.g., latency control circuit 235) in some embodiments of the disclosure.

The signal buffers 410, command decoder 412, read latency control circuit 414, mode register 416, clock buffers 420 and 422, and clock divider circuit 424 may be generally located in a peripheral region of a semiconductor device. For example, with reference to the semiconductor device 300 of FIG. 3, the signal buffers 410, command decoder 412, read latency control circuit 414, mode register 416, clock buffers 420 and 422, and clock divider circuit 424 may be generally located in the center peripheral region 320 in some embodiments of the disclosure.

A signal buffer 430 receives internal data signals from a serializer circuit 432 and provides output data signals DQn. A signal buffer 430 may be included for each output data signal DQn, with each signal buffer circuit receiving a respective data signal and provide a respective output data signal DQ. The internal data signals provided by the serializer circuit 432 may represent consecutive data bits D_n provided in series to the signal buffer circuit 430 to be output as one output data signal DQn. The serializer circuit 432 may receive the data bits D_n in parallel and arrange the data bits D_n consecutively to be provided in series to the signal buffer circuit 430 as an internal data signal. For example, the serializer circuit 432 receives 16 data bits D_0-D_15 in parallel and arranges the data bits consecutively to be provided in series by the signal buffer circuit 430 as the output data signal DQn.

The serializer circuit 432 operates based on clocks provided by a read clock circuit 440. The read clock circuit 440 receives clocks R0, R1, F0, F1 from the clock divider circuit 424 and provides the clocks to the serializer circuit 432 when provided an active control signal R_Trigger (e.g., active high logic level). The control signal R_Trigger is provided by a clock leveling control circuit 444.

The clock leveling control circuit 444 receives at least one of the clocks R0, R1, F0, and F1 from the clock divider circuit 424 and also receives the control signal CDSR from the read latency control circuit 414. In the present example, clocks R0 and R1 are provided to the clock leveling control circuit 444. Mode information may also be provided from the mode register 416 to set operation of the clock leveling control circuit 444. For example, the clock leveling control circuit 444 may be set in a clock leveling mode. When the clock leveling mode is not set, the clock leveling control circuit 444 may provide an active control signal R_Trigger having a timing based on the at least one of the clocks R0, R1, F0, F1.

The clock leveling control circuit 444 may further provide clock leveling feedback W_leveling_out when the clock leveling control circuit 444 is set in the clock leveling mode by the mode information from the mode register 416. A logic level of the clock leveling feedback W_leveling_out may be indicative of a relative timing between the data clock WCK_t and the system clock CK_t. The timing of the data clock WCK_t may be represented by a timing of at least one of the clocks R0, R1, F0, and F1 in some embodiments of the disclosure. The timing of the system clock CK_t may be represented by a timing of the control signal CDSR in some embodiments of the disclosure. In such embodiments, providing the clock leveling feedback W_leveling_out based on a timing of at least one of the clocks R0, R1, F0, and F1 relative to the control signal CDSR may effectively provide the clock leveling feedback W_leveling_out based on the timing of the data clock WCK_t relative to the system clock CK_t.

In operation, the circuits of FIG. 4 may be used to provide the clock leveling feedback W_leveling_out in a clock leveling mode. The clock leveling feedback W_leveling_out may be provided, for example, to a controller that may adjust the timing of signals to a memory to compensate for the timing skew. The clock leveling feedback W_leveling_out may be provided at data terminals DQ in some embodiments of the disclosure. When the clock leveling mode is not set, the circuits may be used to provide output data signals DQn, for example, in response to read commands.

Figure 5:
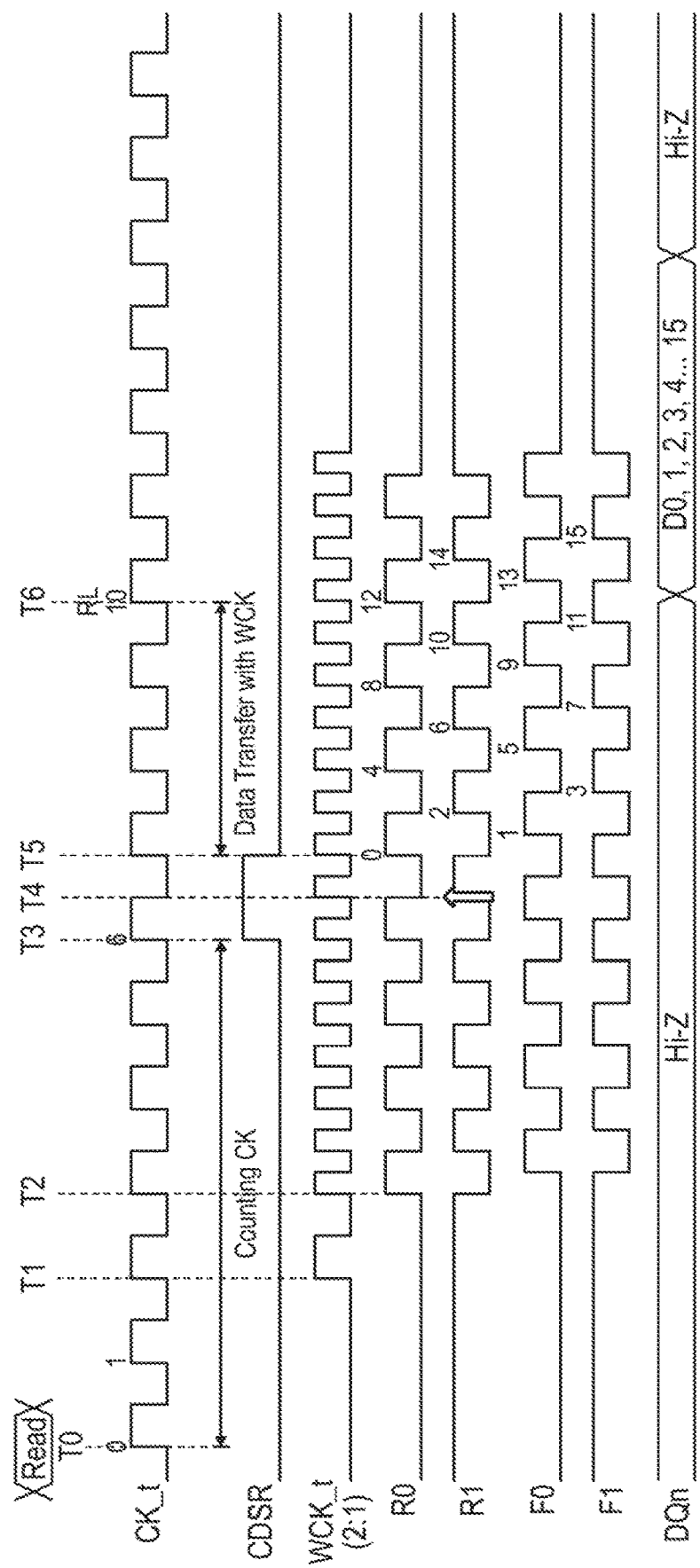
FIG. 5 is a timing diagram of various signals during operation of circuits for a read operation according to an embodiment of the disclosure.

FIG. 5 is a timing diagram of various signals during operation of circuits for a read operation according to an embodiment of the disclosure. The circuits of FIG. 4 may be operated according to the timing diagram of FIG. 5 in some embodiments of the disclosure. The operation of FIG. 5 will be described with reference to the circuits of FIG. 4 for the purposes of providing an example. However, embodiments of the disclosure are not limited to operating the circuits of FIG. 4 as shown in FIG. 5, and operation as described with reference to FIG. 5 is not limited to the particular circuits of FIG. 4. In the example operation of FIG. 5, the mode information does not set the clock leveling mode, the latency is RL=10 CK (e.g., 10 clock cycles of the system clock CK_t), a data path delay is 4 tCK, a 2:1 data clock mode is set, and the burst length is 16.

At time T0, a read command is received by a command and address input circuit (e.g., command and address input circuit 205 of FIG. 2) and a command decoder provides internal control signals to perform a read operation. At time T1, a data clock WCK_t is provided to the clock buffer 422. The data clock WCK_t initially has a clock frequency that is the same as the system clock CK_t, but at time T2, the data clock WCK_t changes to a higher frequency. In the present example, the clock frequency is doubled so that the data clock WCK_t has a clock frequency twice that of the system clock CK_t. The higher frequency data clock WCK_t is provided to the clock divider 424, which provides lower frequency clocks R0, R1, F0, and F1. The clocks R0, R1, F0, and F1 have half the clock frequency of the WCK_t clock, and have a phase relationship of 90 degrees to one another: clock F0 has a 90 degrees phase relative to clock R0; clock R1 has a 90 degree phase relative to clock F0, and clock F1 has a 90 degree phase relative to clock R1. As a result, clocks R0 and R1 are complementary and clocks F0 and F1 are complementary. The clocks R0, R1, F0, and F1 are provided to the read clock circuit 440, and at least one of the R0, R1, F0, and F1 clocks are provided to the clock leveling control circuit 444. In the present example, at least clocks R0 and R1 are provided to the clock leveling control circuit 444.

As previously described, the latency is RL=10 tCK and the data path delay is 4 tCK. In the present example, the read latency control circuit 414 provides an active control signal CDSR at a time following the read command (received at time T0) corresponding to a difference between the latency and a data path delay. For example, with a latency of 10 tCK and a data path delay of 4 tCK, the read latency control circuit 414 provides an active control signal CDSR at 6 tCK following the read command, or shown in FIG. 5, at time T3. The active control signal CDSR may be a pulse signal. With a read operation, the active control signal CDSR may have a pulse width of 1 tCK, as shown in FIG. 5 between times T3 and T5.

With the clock leveling mode not set (e.g., the mode register provides mode information indicating the clock leveling mode is not set), the clock leveling circuit provides an active R_Trigger signal in response to a rising edge of the R1 clock when the CDSR signal is active. The timing of the active R_Trigger signal is represented in FIG. 5 as a bolded arrow at time T4. The active R_Trigger signal is provided to the read clock circuit 440. Prior to receiving the active R_Trigger signal, the read clock circuit 440 does not provide (e.g., blocks) the R0, R1, F0, and F1 clocks to the serializer circuit 432. When the R_Trigger signal becomes active, the read clock circuit provides the R0, R1, F0, and F1 clocks to the serializer circuit 432. The serializer circuit 432 receives the data bits D_0-D_15 in parallel and serializes the data bits D_0-D_15 to be provided to the signal buffer 430 in series as the R0, R1, F0, and F1 clocks are provided. For example, the data bits D_0-D_15 may be loaded into the serializer circuit 432 and the data bits shifted responsive to the R0, R1, F0, and F1 clocks.

In the example of FIG. 5, the data bit D_0 may be shifted responsive to a rising clock edge of the R0 clock at time T5, the data bit D_1 may be shifted responsive to a following rising clock edge of the F0 clock, the data bit D_2 may be shifted responsive to a following rising clock edge of the R1 clock, the data bit D_3 may be shifted responsive to a following rising clock edge of the F1 clock, and so on for the rest of the data bits D_4-D_15. Signals for the serialized data bits D_0-D_15 are provided to the signal buffer 430, which provides output data signals DO-D15 for the data bits D_0-D_15 following the latency of 10 tCK after the read command, which is shown in FIG. 5 at time T6. It will be appreciated that FIG. 5 is provided by way of example, and the timing of the various signals may be different than shown without departing from the scope of the disclosure. For example, in the example of FIG. 5 the rising clock edge of the R0 clock corresponding to data bit D_0 occurs at a next rising clock edge of the R0 clock following activation of the R_Trigger signal (and the rising clock edges of the R1, F0, F1, and R0 clocks corresponding to data bits D_1-D_15 thereafter). However, in some embodiments of the disclosure, the rising clock edge of the R0 clock corresponding to data bit D_0 may occur several clock cycles (of WCK_t and/or CK_t) after the R_Trigger signal becomes active (and thereafter the rising clock edges of the R1, F0, F1, and R0 clocks corresponding to data bits D_1-D_15).

Figure 6:
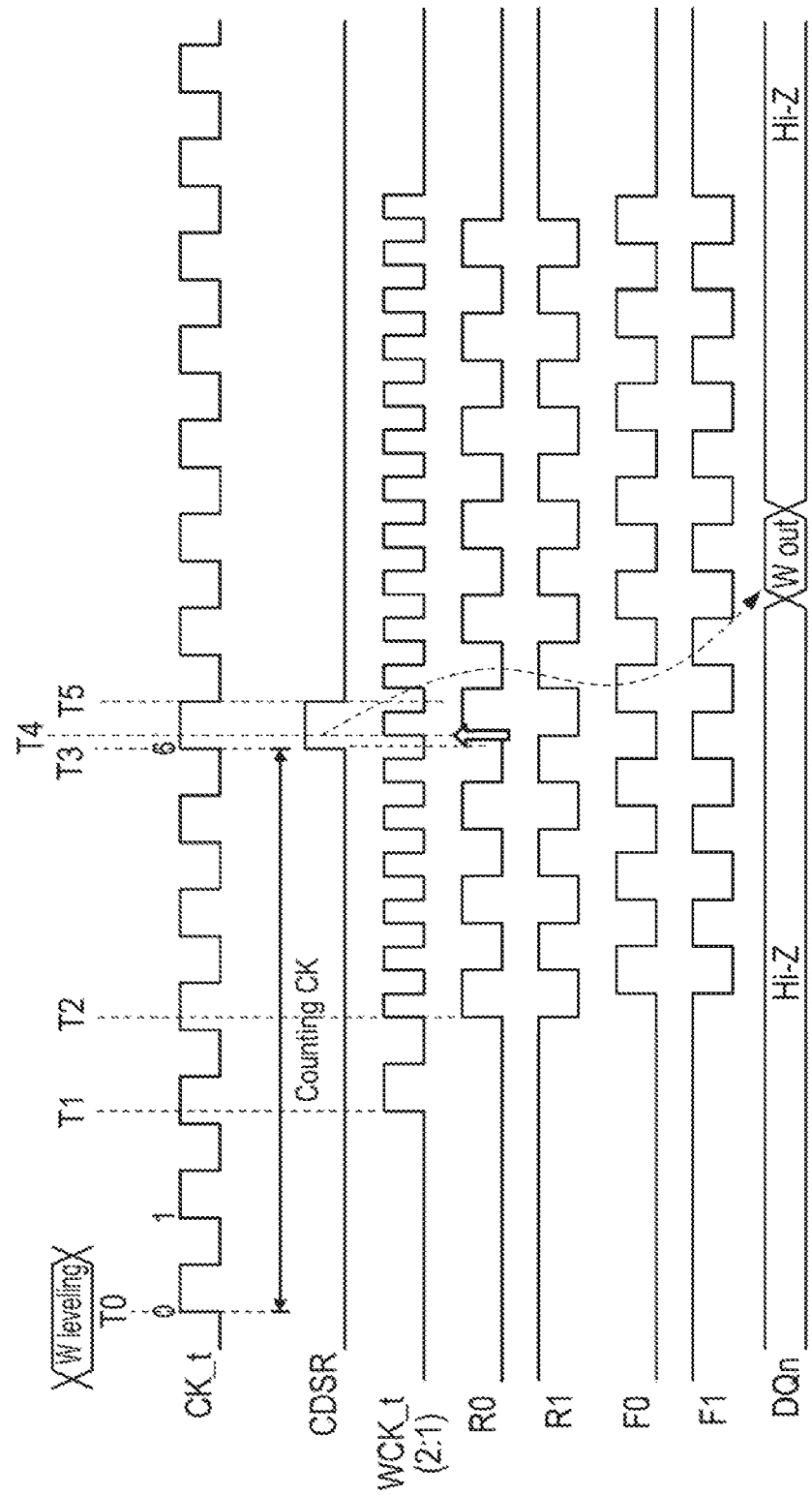
FIG. 6 is a timing diagram of various signals during operation of circuits for a clock leveling operation according to an embodiment of the disclosure.

FIG. 6 is a timing diagram of various signals during operation of circuits for a clock leveling operation according to an embodiment of the disclosure. The circuits of FIG. 4 may be operated according to the timing diagram of FIG. 6 in some embodiments of the disclosure. The operation of FIG. 6 will be described with reference to the circuits of FIG. 4 for the purposes of providing an example. However, embodiments of the disclosure are not limited to operating the circuits of FIG. 4 as shown in FIG. 6, and operation as described with reference to FIG. 6 is not limited to the particular circuits of FIG. 4. In the example operation of FIG. 6, the mode information sets the clock leveling mode, the latency is RL=10 tCK (e.g., 10 clock cycles of the system clock CK_t), a data path delay is 4 tCK, and a 2:1 data clock mode is set.

At time T0, a clock leveling command is received to initiate a clock leveling operation. At time T1, a data clock WCK_t is provided to the clock buffer 422. The data clock WCK_t initially has a clock frequency that is the same as the system clock CK_t, but at time T2, the data clock WCK_t changes to a higher frequency. In the present example, the clock frequency is doubled so that the data clock WCK_t has a clock frequency twice that of the system clock CK_t. The higher frequency data clock WCK_t is provided to the clock divider 424, which provides lower frequency clocks R0, R1, F0, and F1. The clocks R0, R1, F0, and F1 have half the clock frequency of the WCK_t clock, and have a phase relationship of 90 degrees to one another: clock F0 has a 90 degrees phase relative to clock R0; clock R1 has a 90 degree phase relative to clock F0, and clock F1 has a 90 degree phase relative to clock R1. As a result, clocks R0 and R1 are complementary and clocks F0 and F1 are complementary. The clocks R0, R1, F0, and F1 are provided to the read clock circuit 440, and at least one of the R0, R1, F0, and F1 clocks are provided to the clock leveling control circuit 444. In the present example, at least clocks R0 and R1 are provided to the clock leveling control circuit 444.

As previously described, the latency is RL=10 tCK and the data path delay is 4 tCK. In the present example, the read latency control circuit 414 provides an active control signal CDSR at a time following the clock leveling command (received at time T0) corresponding to a difference between the latency and a data path delay. For example, with a latency of 10 tCK and a data path delay of 4 tCK, the read latency control circuit 414 provides an active control signal CDSR at 6 tCK following the read command, or shown in FIG. 5, at time T3. The active control signal CDSR may be a pulse signal. With the clock leveling mode set, the active control signal CDSR may have a pulse width of ½ tCK, as shown in FIG. 6 between times T3 and T5. The pulse width of the active control signal CDSR may be shorter compared to the pulse width of the CDSR for a read operation (e.g., example read operation of FIG. 5). The active control signal CDSR for the clock leveling operation may have a shorter pulse width to avoid being latched by a later rising clock edge of the WCK_t clock (or of one of the clocks R1, F0, or F1). In some embodiments of the disclosure, the read latency control circuit 414 may include a multiplexer that is used to provide the active control signal CDSR having a pulse width of one CK or ½ tCK (e.g., for a read operation or clock level operation, respectively). The multiplexer may be controlled by information from a mode register (e.g., enabling a clock leveling operation) in some embodiments of the disclosure.

With the clock leveling mode set, for example, the mode register provides mode information indicating the clock leveling mode is set, the clock leveling circuit provides clock leveling feedback W_leveling_out in response to a rising edge of the R0 clock when the CDSR signal is active. The timing of the clock leveling feedback W_leveling_out information is represented in FIG. 6 as a bolded arrow at time T4. The write leveling feedback may be indicative of the timing of the data clock WCK_t relative to the system clock CK_t. The timing of the data clock WCK_t may be represented by one or more of the clocks R0, R1, F0, and F1, and the timing of the system clock CK_t may be represented by the active control signal CDSR. As such, the logic level of the clock leveling feedback W_leveling_out may be based on the relative timing of one or more of the clocks R0, R1, F0, and F1 and the timing of when the control signal CDSR becomes active based on a latency value and the clock leveling command (e.g., active at time 6 tCK (10 tCK−4 tCK) following the clock leveling command).

For example, in some embodiments of the disclosure, the clock leveling feedback W_leveling_out may have a first logic level (e.g., a low logic level) when the control signal CDSR is still inactive (e.g., inactive logic low level) for a rising clock edge of the clock R0 and have a second logic level (e.g., a high logic level) when the control signal CDSR is active (e.g., active high logic level) for the rising clock edge of the R0 clock.

In the example shown by FIG. 6, the control signal CDSR resulting from the clock leveling command is already active when the R0 clock transitions to a high clock level. As a result, the clock leveling feedback W_leveling_out provided by the clock leveling control circuit 444 has a second (high) logic level. The clock leveling feedback W_leveling_out is provided to the signal buffer 430 to be provided as one or more of the output data signals DQn at a time following time T4 (e.g., "W out" in FIG. 6). In some embodiments of the disclosure, the clock leveling feedback W_leveling_out is provided as one of the data signals DQn. In some embodiments of the disclosure, the clock leveling feedback W_leveling_out is provided as all of the data signals DQn.

As previously described the clock leveling feedback W_leveling_out may assist a controller to adjust a relative timing between the system clock CK_t and the data clock WCK_t. For example, the clock leveling operation is repeated after adjusting the delay setting (e.g., of delay circuits in a clock divider circuit) to identify when the clock leveling feedback W_leveling_out changes from one logic level to the other. The delay setting at which this occurs may correspond to when the timing of the system clock CK_t and the data clock WCK_t are aligned.

Figure 7:
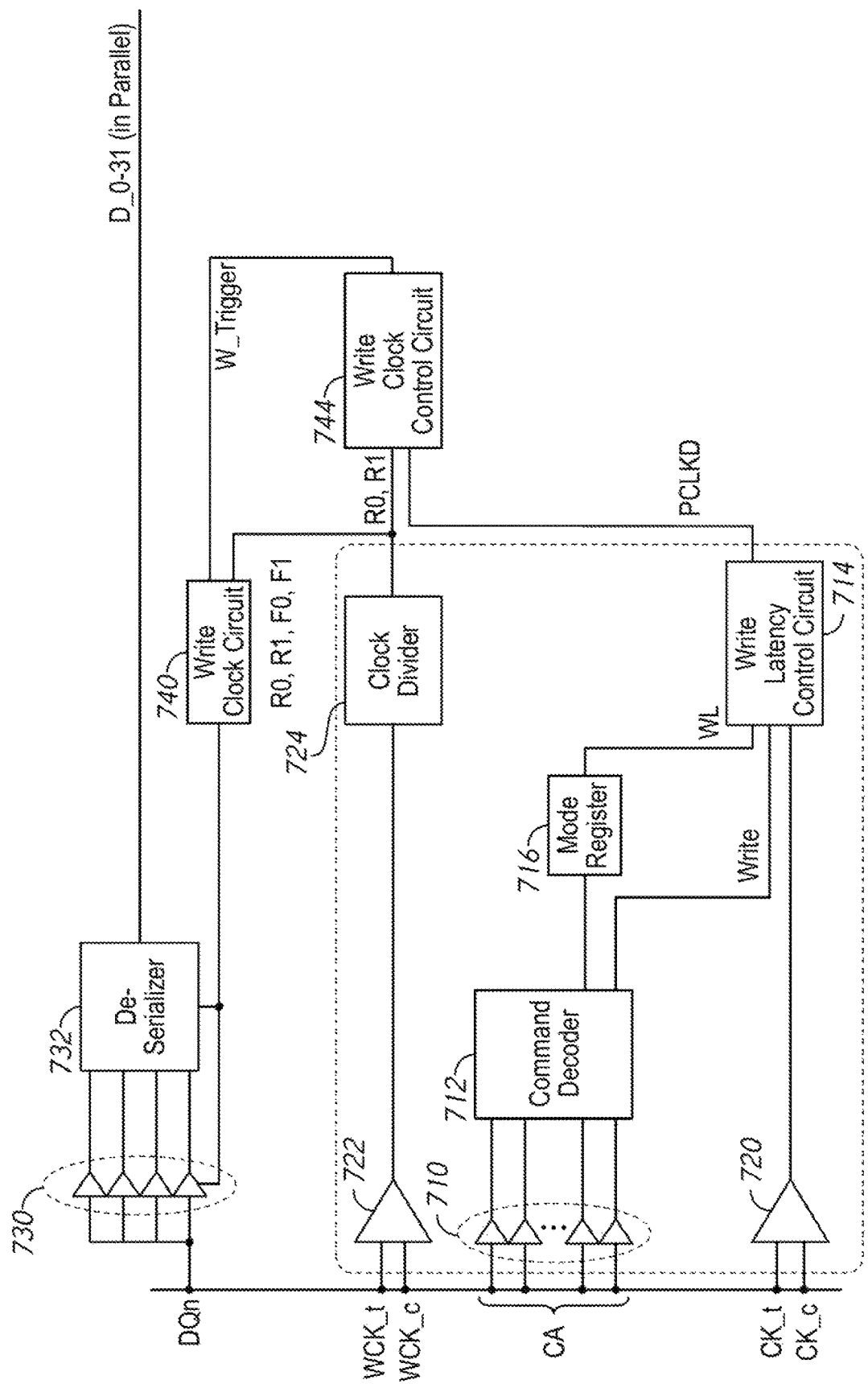
FIG. 7 is a diagram of circuits for write operations for a semiconductor device according to an embodiment of the disclosure.

FIG. 7 is a diagram of circuits for write operations for a semiconductor device according to an embodiment of the disclosure. The circuits of FIG. 7 may be included in various circuits of a semiconductor device, for example, semiconductor device 100 of FIG. 1. For example, in some embodiments of the disclosure, the circuits of FIG. 7 may be included amongst the clock input circuit 220, command decoder 215, mode register 238, internal clock circuits 230, serializer/deserializer circuit 255, input/output circuit 260, read/write clock circuit 259, clock leveling control circuit 257, and/or latency control circuit 235.

Signal buffers 710 receive command and address signals CA and provide buffered CA signals to a command decoder 712. The command decoder 712 decodes the buffered CA signals and provides internal control and timing signals to perform operations accordingly. For example, the command decoder 712 may decode a read command from the buffered CA signals and provide internal control signal Write to a write latency control circuit 714. In some embodiments of the disclosure, the write latency control circuit 714 may include a counter circuit.

The command decoder 712 may also access mode information programmed in a mode register 716. The mode information may be programmed in the mode register 716 to select and/or set various operating conditions for circuits of the semiconductor device. For example, latency values (e.g., read latency RL, write latency WL, etc.) may be set by programming values that correspond to ranges of system clock frequency.

A clock buffer 720 receives and buffers the system clock CK_t (and its complement CK_c) and provides buffered system clock(s) to the write latency control circuit 714. The write latency control circuit 714 may provide an active control signal PCLKD having a timing based at least in part on a number of clock cycles of the buffered system clock. For example, an active control signal PCLKD may be provided at a number of clock cycles following a write command that is based on a difference between a latency value WL and a data path delay. The data path delay may be a propagation delay through a data path as measured in clock cycles of the system clock CK_t. In some embodiments of the disclosure, an active control signal PCLKD may be a pulse signal, that is, the PCLKD signal transitions to a high logic level for a period of time (e.g., pulse width) before returning to a low logic level.

A clock buffer 722 receives and buffers a data clock WCK_t (and its complement WCK_c) and provides buffered data clock(s) to a clock divider circuit 724. The data clock WCK_t may have a higher clock frequency than the system clock CK_t. For example, in some embodiments of the disclosure, the data clock WCK_t may have twice the clock frequency of the CK_t clock. In some embodiments of the disclosure, the data clock WCK_t may have four times the clock frequency of the CK_t clock.

The clock divider circuit 724 provides clocks R0, R1, F0, F1 based on the buffered data clock. The clocks R0, R1, F0, F1 have clock frequencies that are lower than the frequency of the data clock WCK_t (and WCK_c) and have phases relative to one another. For example, in some embodiments of the disclosure, the F0 clock may have a phase of 90 degrees relative to the R0 clock, the R1 clock may have a phase of 90 degrees relative to the F0 clock, and the F1 clock may have a phase of 90 degrees relative to the R1 clock. In such embodiments, the R0 and R1 clocks may be complementary and the F0 and F1 clocks may be complementary.

In some embodiments of the disclosure, the clock divider circuit 724 may include circuits (e.g., delay circuits) for shifting the timing of the clocks R0, R1, F0, F1. Shifting the timing of the clocks R0, R1, F0, F1 may be used to adjust a timing relative to another clock or signal, such as relative to the control signal PCLKD (and the system clock CK_t).

The signal buffers 710 may be included in a command and address input circuit (e.g., command and address input circuit 205 of FIG. 2) in some embodiments of the disclosure. The command decoder 712 may be included in a command decoder (e.g., command decoder 215) in some embodiments of the disclosure. The clock buffers 720 and 722 may be included in a clock input circuit (e.g., clock input circuit 220) in some embodiments of the disclosure. The clock divider circuit 724 may be included in an internal clock circuit (e.g., internal clock circuits 230) in some embodiments of the disclosure. The mode register 716 may be in a mode register (e.g., mode register 238) in some embodiments of the disclosure. The latency control circuit 714 may be included in a latency control circuit (e.g., latency control circuit 235) in some embodiments of the disclosure.

The signal buffers 710, command decoder 712, latency control circuit 714, mode register 716, clock buffers 720 and 722, and clock divider circuit 724 may be generally located in a peripheral region of a semiconductor device. For example, with reference to FIG. 3, when included in the semiconductor device 300, the signal buffers 710, command decoder 712, latency control circuit 714, mode register 716, clock buffers 720 and 722, and clock divider circuit 724 may be generally located in the center peripheral region 320 in some embodiments of the disclosure.

A signal buffer 730 receives input data signals DQn and provides buffered input data signals to a deserializer circuit 732. The signal buffer 730 may include several signal buffer circuits, with each signal buffer circuit receiving a respective input data signal DQn. Each of the input data signals provided to and buffered by the signal buffer 730 may represent consecutive input data bits provided in series. The deserializer circuit 732 may receive the data bits in series from each of the signal buffer circuits and arrange the serial data bits to be provided as parallel data bits. For example, the serial data bits provided by the input data signals DQn are arranged by the deserializer circuit 732 to provide 32 data bits D_0-D_31 in parallel.

The deserializer circuit 732 operates based on clocks provided by a write clock circuit 740. The write clock circuit 740 receives clocks R0, R1, F0, F1 from the clock divider circuit 724 and provides the clocks to the deserializer circuit 732 when provided an active control signal W_Trigger (e.g., active high logic level). The control signal W_Trigger is provided by a write clock control circuit 744.

The write clock control circuit 744 receives at least one of the clocks R0, R1, F0, and F1 from the clock divider circuit 724 and also receives the control signal PCLKD from the write latency control circuit 714. In the present example, clocks R0 and R1 are provided to the write clock control circuit 744. In operation, the circuits of FIG. 7 may be used to receive input data signals DQn, for example, in response to write commands. For example, based on the timing of the control signal PCLKD and at least one of the clocks R0, R1, F0, F1, the write clock control circuit 744 provides an active control signal W_Trigger to the write clock circuit 740. As previously described, the active control signal W_Trigger controls the write clock circuit 740 to provide the clocks R0, R1, F0, F1 to the deserializer circuit 732 to receive the data bits from the signal buffer 730.

In some embodiments of the disclosure, some circuits shown in FIGS. 4 and 7 may be provided by a common circuit. For example, the signal buffers 410 and 710 may be a common (e.g., the same) circuit in some embodiments of the disclosure. Additionally or alternatively, command decoders 412 and 712 may be a common circuit, mode registers 416 and 716 may be a common circuit, clock buffers 420, 422, 720, and 722 may be common circuits, and/or clock divider circuits 424 and 724 may be common circuits in some embodiments of the disclosure. In some embodiments of the disclosure, a common signal buffer may be used for receiving command and address signals CA and provide buffered CA signals to a common decoder as an example. Others of the circuits may be provided by a common circuit as well. In some embodiments of the disclosure, the write latency circuit 714 is a separate circuit from the read latency circuit 414 of FIG. 4. Additionally or alternatively, the write clock control circuit 744 is a separate circuit from the clock leveling control circuit 444 in some embodiments of the disclosure. In such embodiments, having a separate circuits may allow timing specifications to be satisfied while avoiding potential data/command collisions between write and read operations. The read and write operations may overlap, with each of the respective circuits operating independently of the other circuits to perform the respective operations.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. A memory, comprising:
 a mode register configured to be programmed with information for setting a clock leveling mode and to be programmed with latency information;
 a clock divider circuit configured to receive a data clock and provide a plurality of clocks based on the data clock;
 a latency control circuit configured to receive the latency information and further configured to provide a first control signal, the latency control circuit configured to provide an active first control signal having a timing based at least in part on the latency information and a system clock;
 a clock leveling control circuit configured to receive first and second clocks of the plurality of clocks and receive the first control signal, the clock leveling control circuit configured for an access operation to provide an active second control signal responsive to the active first control signal at a clock transition of the first clock and further configured for the clock leveling mode to provide clock leveling feedback responsive to the active first control signal at a transition of the second clock, wherein the clock leveling feedback indicative of a relative timing of the data clock and system clock;
 a read clock circuit configured to receive the second control signal from the clock leveling control circuit and receive the plurality of clocks from the clock divider circuit, the read clock circuit further configured to provide the plurality of clocks when activated responsive to the active second control signal; and
 a serializer circuit configured to receive internal data in parallel and arrange the internal data to be provided serially responsive to the plurality of clocks from the read clock circuit.

2. The memory of claim 1 wherein the active first control signal comprises a pulse having a first pulse width for the access operation and having a second pulse width different than the first pulse width for the clock leveling mode.

3. The memory of claim 2 wherein the latency control circuit comprises a multiplexer used to provide the active first control signal having the first pulse width for the access operation and having the second pulse width for the clock leveling mode.

4. The memory of claim 1 wherein the clock leveling control circuit is configured to provide the clock leveling feedback having a first logic level responsive to the data clock leading the system clock and provide the clock leveling feedback having a second logic level responsive to the data clock lagging the system clock.

5. The memory of claim 1, further comprising:
 a second latency control circuit configured to receive second latency information from the mode register and further configured to provide a third control signal, the second latency control circuit configured to provide an active third control signal having a timing based at least in part on the second latency information and the system clock;
 a clock control circuit configured to receive the first and second clocks of the plurality of clocks and receive the third control signal, the clock control circuit configured for a write operation to provide an active fourth control signal responsive to an active third control signal at a clock transition of the first clock;
 a write clock circuit configured to receive the fourth control signal from the clock control circuit and receive the plurality of clocks from the clock divider circuit, the write clock circuit further configured to provide the plurality of clocks when activated responsive to the active fourth control signal; and
 a deserializer circuit configured to receive data in series and arrange the serial data bits to provide internal data in parallel responsive to the plurality of clocks.

6. The memory of claim 1 wherein the mode register, clock divider circuit, and latency control circuit are located in a peripheral center region.

7. The memory of claim 6 wherein the clock leveling circuit, read clock circuit, and the serializer circuit are located outside of the peripheral center region.

8. The memory of claim 1 wherein the mode register is further configured to be programmed with information to set an internal clock frequency, and wherein the data clock has a first clock frequency corresponding to a first value for the information to set the internal clock frequency and the data clock has a second clock frequency corresponding to a second value for the information to set the internal clock frequency, the first and second frequencies multiples of a clock frequency of the system clock.

9. An apparatus, comprising:
 a latency control circuit configured to receive a system clock and provide in first and second modes an active first control signal having a timing based on latency information and the system clock;
 a clock leveling control circuit configured to receive first and second clocks of a plurality of multiphase clocks and receive the first control signal, the clock leveling control circuit configured to provide in the first mode an active second control signal responsive to an active first control signal at a clock transition of the first clock and further configured to provide in the second mode clock leveling feedback responsive to the active first control signal at a transition of the second clock, wherein the clock leveling feedback is indicative of a timing of the data clock and system clock;

a read clock circuit configured to receive the plurality of multiphase clocks and configured to provide the multiphase clocks responsive to the active second control signal; and a serializer circuit configured to receive data in parallel and serialize the data based on the multiphase clocks from the read clock circuit to provide the data in series.

10. The apparatus of claim 9 wherein the active first control signal provided by the latency control circuit comprises a pulse signal.

11. The apparatus of claim 10 wherein the pulse signal has a pulse width of one clock cycle of the system clock in the first mode and the pulse signal has a pulse width of one-half clock cycle of the system clock in the second mode.

12. The apparatus of claim 9, further comprising a mode register configured to be programmed to set the second mode.

13. The apparatus of claim 9 wherein the first mode comprises a read access operation.

14. The apparatus of claim 9, further comprising:

a write latency control circuit configured to receive the system clock and provide in first and second modes an active third control signal having a timing based on latency information and the system clock;

a write clock control circuit configured to receive first and second clocks of the plurality of multiphase clocks, the clock leveling control circuit configured to provide in the first mode an active fourth control signal responsive to the active third control signal at a clock transition of the second clock;

a write clock circuit configured to receive the plurality of multiphase clocks and configured to provide the multiphase clocks responsive to the active fourth control signal; and a deserializer circuit configured to receive data in series and deserialize the data based on the multiphase clocks from the write clock circuit to provide the data in parallel.

15. The apparatus of claim 9 wherein the plurality of multiphase clocks comprises a 0 phase clock, a 90 phase clock, a 180 phase clock, and a 270 phase clock.

16. The apparatus of claim 15 wherein the first clock comprises the 0 phase clock and the second clock comprises the 180 phase clock.

17. A method, comprising:

providing an active first control signal having a timing based on latency information and a system clock;

receiving first and second clocks of a plurality of multiphase clocks;

during an access operation, providing from a clock leveling control circuit an active second control signal responsive to the active first control signal at a clock transition of the first clock;

in a clock leveling mode, providing from the clock leveling control circuit a clock leveling feedback having a logic level based on the active first control signal at a transition of the second clock;

providing the multiphase clocks responsive to the active second control signal; and serializing parallel data based on the multiphase clocks responsive to the active second control signal to provide the data in series.

18. The method of claim 17 wherein providing the active first control signal comprises providing for the access operation an active pulse signal having a first pulse width and providing in the clock leveling mode an active pulse signal having a second pulse width, wherein the second pulse width is less than the first pulse width.

19. The method of claim 17 wherein the plurality of multiphase clocks is based on a data clock and wherein the logic level of the clock leveling feedback is indicative of the timing of the data clock relative to the system clock.

20. The method of claim 17, further comprising:

providing an active third control signal having a timing based on write latency information and the system clock;

during a write operation, providing from a write clock control circuit an active fourth control signal responsive to the active third control signal at a clock transition of the second clock;

providing the multiphase clocks responsive to the active fourth control signal; and deserializing serial data based on the multiphase clocks responsive to the active fourth control signal to provide the data in parallel.

* * * * *